United States Patent [19]

Brown

[11] 4,079,373
[45] Mar. 14, 1978

[54] DIGITAL-TO-ANALOG CONVERSION APPARATUS USING TEMPERATURE COMPENSATED FEEDBACK OUTPUT AMPLIFIER

[75] Inventor: James L. Brown, Toddville, Iowa

[73] Assignee: Rockwell International Corporation, El Segundo, Calif.

[21] Appl. No.: 715,775

[22] Filed: Aug. 19, 1976

[51] Int. Cl.² .............................................. H03K 13/02
[52] U.S. Cl. ........................ 340/347 DA; 340/347 M
[58] Field of Search .................... 340/347 DA, 347 M

[56] References Cited

U.S. PATENT DOCUMENTS 3,757,261 9/1973 Sather .................................. 235/152
4,006,475 2/1977 Candy et al. ................. 340/347 DA Primary Examiner—Thomas J. Sloyan
Attorney, Agent, or Firm—Richard A. Bachand; H. Fredrick Hamann

[57] ABSTRACT

A serial data input to analog voltage output converter uses an R adder for continually adding a given digital input word to an accumulated result and providing either a positive or negative overflow whenever the accumulated result exceeds the capacity of the adding device. The frequency of occurrence of overflow is filtered to provide the analog output signal. Compensation techniques provide high accuracy despite temperature dependent resistances and current leakages incurred in MOS or other switch and filtering circuitry.

6 Claims, 3 Drawing Figures

| A | B | Q | $+\Delta Y$ | $-\Delta Y$ | $\overline{SB}$ $R_{ob}$ / $R_{ou}^+$ | $Q_{n+1}$ | $+\Delta Z_{n+1}$ | $-\Delta Z_{n+1}$ | SB $R_{ob}$ | $R_{ou}$ | $Q_{n+1}$ | $+\Delta Z_{n+1}$ | $-\Delta Z_{n+1}$ |
|---|---|---|---|---|---|---|---|---|---|---|---|---|---|
| 0 | 0 | 0 | 0 | 0 | 0 | 0 |   |   | 0 | 0 | 0 | 0 | 0 |
| 1 | 0 | 0 | 0 | 0 | 1 | 0 |   |   | 1 | 1 | 0 | 0 | 0 |
| 0 | 1 | 0 | 0 | 0 | 0 | 0 |   |   | 0 | 0 | 0 | 0 | 0 |
| 1 | 1 | 0 | 0 | 0 | 1 | 0 |   |   | 1 | 1 | 0 | 0 | 0 |
| 0 | 0 | 0 | 1 | 0 | 0 | 0 |   |   | 0 | 0 | 0 | 0 | 0 |
| 1 | 0 | 0 | 1 | 0 | 1 | 0 |   |   | 1 | 1 | 0 | 0 | 0 |
| 0 | 1 | 0 | 1 | 0 | 1 | 0 |   |   | 1 | 1 | 0 | 0 | 0 |
| 1 | 1 | 0 | 1 | 0 | 0 | 1 |   |   | 1 | 0 | 0 | 0 | 1 |
| 0 | 0 | 1 | 1 | 0 | 1 | 0 | NO | | 0 | 1 | 0 | 1 | 0 |
| 1 | 0 | 1 | 1 | 0 | 0 | 1 | CHANGE | | 0 | 0 | 0 | 0 | 0 |
| 0 | 1 | 1 | 1 | 0 | 0 | 1 |   |   | 0 | 0 | 0 | 0 | 0 |
| 1 | 1 | 1 | 1 | 0 | 1 | 1 |   |   | 1 | 1 | 0 | 0 | 0 |
| 0 | 0 | 0 | 0 | 1 | 0 | 0 |   |   | 0 | 0 | 0 | 0 | 0 |
| 1 | 0 | 0 | 0 | 1 | 1 | 0 |   |   | 1 | 1 | 0 | 0 | 0 |
| 0 | 1 | 0 | 0 | 1 | 1 | 1 |   |   | 0 | 1 | 0 | 1 | 0 |
| 1 | 1 | 0 | 0 | 1 | 0 | 0 |   |   | 0 | 0 | 0 | 0 | 0 |
| 0 | 0 | 1 | 0 | 1 | 1 | 1 |   |   | 1 | 1 | 0 | 0 | 0 |
| 1 | 0 | 1 | 0 | 1 | 0 | 0 |   |   | 1 | 0 | 0 | 0 | 1 |
| 0 | 1 | 1 | 0 | 1 | 0 | 1 |   |   | 0 | 0 | 0 | 0 | 0 |
| 1 | 1 | 1 | 0 | 1 | 1 | 1 |   |   | 1 | 1 | 0 | 0 | 0 |

FIG. 3

DIGITAL-TO-ANALOG CONVERSION APPARATUS USING TEMPERATURE COMPENSATED FEEDBACK OUTPUT AMPLIFIER

THE INVENTION

The present invention is generally related to electronics and more specifically to a digital serial word to analog signal converter.

Although there are many types of digital to analog converters on the market, it is not only believed that the present inventive concept provides a new approach to obtaining the conversion but in addition advances a method of compensating for temperature dependent elements in the analog portion thereof to provide an accurate device over a wide temperature range.

It is thus an object of the present invention to provide an improved digital-to-analog converter.

Other objects and advantages of the present invention will be apparent from a reading of the specification and appended claims in conjunction with the drawings wherein:

FIG. 3 is a truth table used in explaining the operation of FIG. 2.

DETAILED DESCRIPTION

Figure 1:
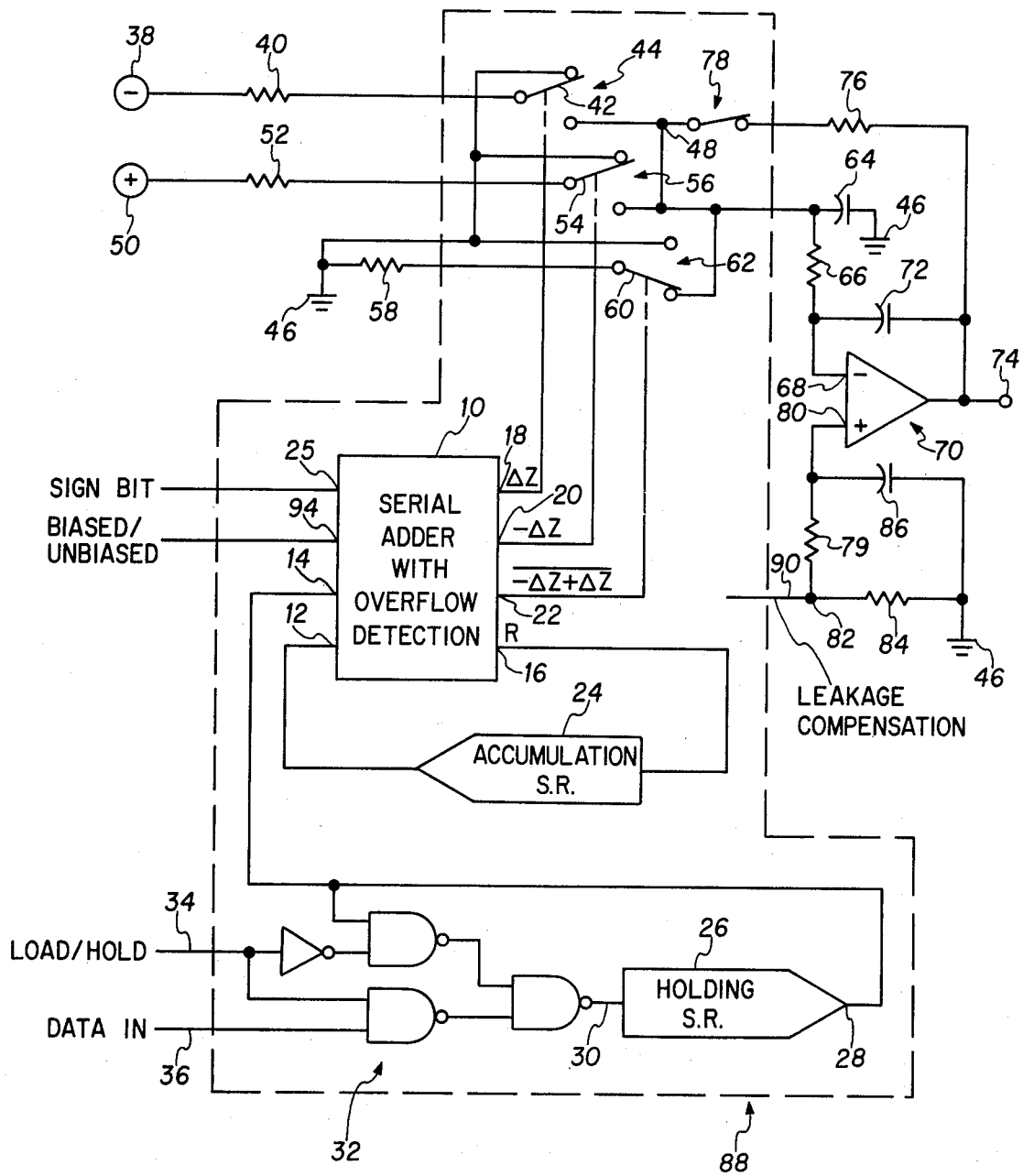
FIG. 1 is a schematic block diagram of the inventive concept.

In the drawing, a serial adder 10 is illustrated having a first data input 12 and a second input 14. Adder 10 has a remainder output 16 as well as a positive overflow output 18, a negative overflow output 20 and a "not" overflow output 22. The "not" overflow output may be obtained by taking the two outputs 18 and 20 and applying these to a NOR gate for output 22. Thus, it is merely an output indicative of the fact that there is no output on either 18 or 20. An accumulation register 24 is connected between output 16 and input 12. The adder 10 also has a sign bit or sync bit input 25. The adder 10 may be any type of adder providing overflow indication and providing an output indicative of the remainder when overflow occurs. However, one such type of adder is called an R adder and is illustrated in more detail in FIG. 1 of U.S. Pat. No. 3,757,261 as well as FIG. 2 of this application. The ΔY— input may be ignored since the capability of subtraction is not required. Thus, the ΔY+ input would be tied to a logic one potential so that the device would continually add.

A shift register 26 presents an output 28 and has an input 30. Output 28 is supplied both to input 14 of adder 10 and through a set of logic circuitry generally designated as 32 back to the input of shift register 26 when an appropriate logic level appears on lead 34 for supplying signals to logic gate 32. A different logic level for input 34 will supply input signals from a further lead 36 supplying new input data to shift register 26.

A negative voltage reference appearing on a lead 38 is supplied through a resistor 40 to a solid state switch 44 shown for illustrative purposes as a mechanical switch having a movable contact 42. The movable contact 42 alternates between an analog ground lead 46 and an output lead, terminal or junction point 48. A positive reference voltage 50 supplies signals through a resistor 52 to a movable contact 54 of a similar solid state switch generally designated as 56. Again, the movable contact 54 alternates between ground 46 and terminal 48. The analog ground lead 46 is also connected through a resistor 58 to a movable contact 60 of a switch generally designated as 62 and is alternately connected between leads 46 and 48 as in the manner previously mentioned for switches 44 and 56. Junction point 48 is connected through a capacitor 64 to ground 46 and is also connected through a resistor 66 to a negative or inverting input 68 of an operational amplifier 70. A capacitor 72 is connected between an output 74 of amplifier 70 and input 68. Output 74 is also connected through a resistor 76 to a terminal of a switch generally designated as 78 which has its movable contact connected to junction point 48. A resistor 79 is connected between a non-inverting or positive input 80 of amplifier 70 and a junction point 82. A further resistor 84 is connected between junction point 82 and ground 46. A capacitor 86 is connected between input 80 and ground 46.

A dashed line block includes all of the previously mentioned switches as well as the adder and the shift registers. This dashed line block is designated as 88. A lead 90 comes from block 88 to junction point 82. This lead 90 is connected, in an MOS application, to channel, drain and source areas representing the total areas of the switches 44, 56, 62 and 78 in their operating conditions so as to provide a total leakage current directly indicative of the substrate leakage current attributable to these switches. Since this leakage current varies with temperature, the current in lead 90 is utilized to provide compensation over temperature of this leakage current.

Figure 2:
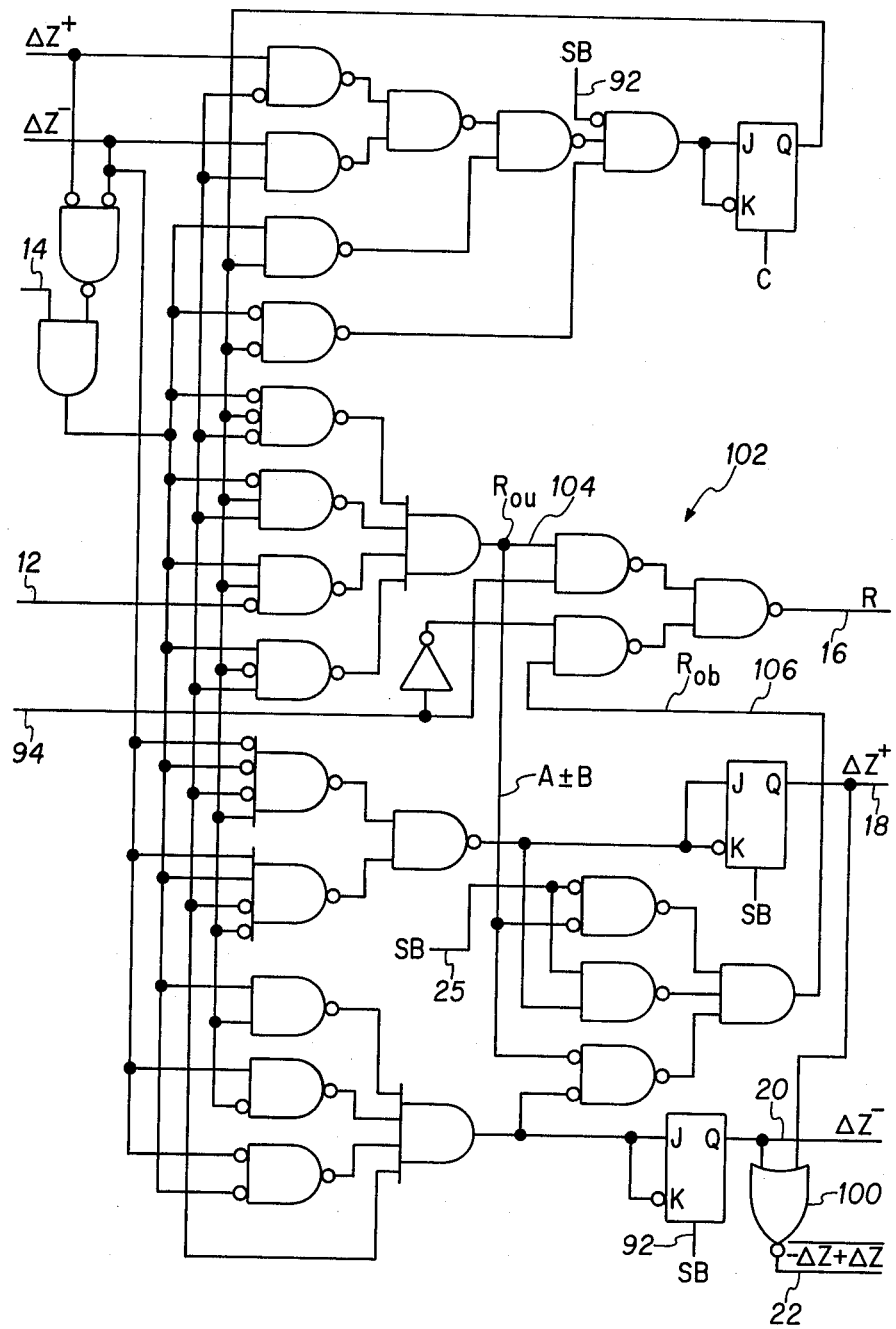
FIG. 2 is a detailed block diagram of one embodiment of a serial adder 10 of FIG. 1.

A further input to the adder 10 is a bias/unbiased input 94 which is used to change the mode of operation of the adder as explained in conjunction with FIG. 2 below.

It should be realized that amplifier 70 in conjunction with capacitor 72, resistor 66, feedback resistor 76, capacitor 64 and an input resistance represented by one of 40, 52 and 58 comprises a two-pole lowpass filter. Simpler filters (such as may be obtained by not using resistor 66 and capacitor 64) could be utilized to practice the present invention, and the compensation circuitry would accordingly be slightly simpler by the elimination of resistor 79. However, the use of this filter reduces distortion of the received charge while allowing the use of a less expensive amplifier 70 to maintain linearity of filtering.

As mentioned previously, the circuit of FIG. 2 is basically that illustrated in the referenced patent. However, there have been two additions illustrated. The first is a NOR gate 100 which combines the ΔZ+ outputs 18 and 20 to provide the −ΔZ+ΔZ output 22. A further alteration is the circuitry generally labeled as 102 which provides a switching function within the adder so as to provide an output lead 16 either unbiased or biased outputs. The switching is in accordance with the presence or absence of a logic 1 on input lead 94. With a logic 1 input, the $R_{ou}$ output designated 104 is supplied to output 16. With a logic 0 input the $R_{ob}$ 106 is supplied to output 16. Since the two signals are mutually exclusive, there is no possibility of interference.

From the truth table of FIG. 3, it will be noted that when there is no sign or sync bit appearing on lead 25 the outputs from either of leads 104 and 106 are identical. It is only when there is a logic 1 on lead 25 that there is a difference between biased or unbiased operation. Perusal of FIG. 3 will illustrate the differences.

The adder in the referenced patent operated on a biased condition such that when overflow occurred, the device overflowed to a 0 condition. It is oftentimes desirable for the device to overflow from a positive number to the most negative possible number. Using an example of 16 bits of operation, the next number after the most positive number of 32,767, overflow would proceed to −32,768. In the alternate mode of overflow from negative, the device would overflow from −32,768 to a positive 32,767. The present inventive concept will operate with either the biased or unbiased mode of operation. In the biased mode, the pulse density to the switches 44, 56 and 62 can be 100% with a full scale input word while in the unbiased operation the pulse density to these switches will be 50% with a full scale input word. Therefore, the pulse density pulses to the switches, in the biased mode, will not be adjacent except for a minus full scale input. At this time, two pulses will appear adjacent every 65,535 word times. Using this mode of operation, the conversion non-linearities will be minimized.

A further change is that in biased operation, the pulse density frequency will be twice the frequency of that associated with unbiased operation. Thus, the digital-to-analog bandwidth is double that of unbiased operation with the same considerations for ripple content at the filter output 74.

Since in the biased mode of operation, pulse density pulses can be adjacent when a digital input of greater than one-half full-scale is used, conversion non-linearity will result if the time increment of current of two non-adjacent pulses is not identical in value with the time increment of current of two adjacent pulses.

Since R adders are a subject of the prior art, no further discussion will be provided on this subject.

OPERATION

The operation of the present inventive concept is that a given digital word is serially supplied to shift register 26 and this word is serially output on lead 28 once every word time and returned to input 30. This word is also input at 14 to serial adder 10. Thus, this word is continuously circulated and added to the word accumulated in register 24 so that each word time the word in register 24 is increased by the value of the word in 26. Periodically, the accumulated word in 24 will exceed the capacity of adder 10 and thus result in an overflow indication on either input 18 or 20. If it overflows in the negative direction, the output indication thereof will be obtained on lead 20, while if the output overflows in the positive direction, the output will be provided on lead 18. The remainder of the excess over the capacity of serial adder 10 is placed in accumulation register 24 and the word value again builds up each word time until overflow again occurs. It can be quickly determined that filtering of this output (pulses of one word time duration) will provide an analog equivalent of the magnitude of the digital word supplied to shift register 26. It is believed that this digital-to-analog conversion concept in and of itself is novel.

The remaining circuitry illustrated in the present invention is for the purpose of obtaining an analog accuracy while using MOS components which far exceeds any other known digital-to-analog technique having the simplicity of the present invention. Since MOS switches as represented by 44, 56, 62 and 78 are in actuality FET transistors which have leakage currents and are not perfect, compensating techniques have been utilized to prevent error due to leakage in switches 44 and 56. If ideal switches were used, only switches 44 and 56 would be required. Under this assumed and idealized mode of operation, the occurrence of an overflow condition on lead 18 or 20 would close either switch 44 or 56 and supply a given charge from reference 38 or 50, respectively, to be filtered in the output circuitry. If the word in shift register 26 were numerically large, the overflow would occur very often and a high analog output would be obtained. On the other hand, if the word in shift register 26 were very small, it would take a long time between the occurrence of overflow conditions and thus the filtered average of these occasional pulses would provide a very small analog signal. Not only does the leakage current of these switches change, but so does the internal or pass resistance. Thus, switch 78 is used to make the total resistance of feedback resistor 76 and switch 78 identical to the resistance of the input resistor 40 or 52 in combination with its respective switch 44 or 56. Since with small words in shift register 26, the switches 44 and 56 will normally be open, a further switch 62 must be inserted between ground and junction point 48 to compensate for the closed switch 78. An additional benefit of this switch 78 is that it maintains the gain and source impedance of operational amplifier 70 at a given value when switches 44 and 56 are open and thus eliminates spikes and discontinuities in the filtered output.

The resistor 66, used in the filter affects the input bias current of amplifier 70. Thus, a further compensating resistor 79 of the same resistive value as 66 is connected to the non-inverting input of amplifier 70. The output 74 is near A. C. ground potential and the sources 38 and 50 are also near A. C. ground potential. Thus, the resistor 76 in parallel with one of the three resistors 40, 52 and 58 produces an additional impedance to ground of approximately 25,000 ohms. Thus, resistor 84 is inserted into the circuit with a resistive value of approximately that of the parallel impedance of resistor 76 with its appropriate switched resistor.

Finally, the combined leakage currents of duplicates of the four illustrated switches is provided on lead 90 so that any inaccuracies due to leakage currents applied to input 68 of operational amplifier 70 is also applied to input 80 and thus there is compensation for the distortion induced thereby. The result of such compensation is to provide a set of switches and accompanying filter circuit which is much more accurate, simple and temperature stable than any other known digital-to-analog converter.

Capacitor 86 operates to filter out high frequency extraneous noise which might otherwise be coupled to the input of amplifier 70 and thus appear at output 74.

In summary, the present inventive concept continually adds a digital input word to the previous added results or sums until overflow occurs thereby closing one of the switches 44 or 56 to add a prescribed current charge through the filter utilizing amplifier 70. The remainder over and above the overflow condition is reinserted in the accumulation register 24 and the digital input word is again added until overflow occurs. While for a given temperature, this is fairly accurate, there is leakage through the various switches to ground and compensation for this leakage is provided using the lead 90 which is connected to four dummy switches which are used only for compensation. This leakage compensation is applied to the non-inverting side of amplifier 70 to compensate for the leakage of the four switches on the inverting side. To further compensate for temperature resistance variation, a switch 78 is used in the feedback loop of amplifier 70 in the expectation that its impedance will vary in the same manner as the switches 44, 56 and 62. Thus, the resistance of switch 78 in combination with resistor 76 will keep the same ratio as compared with the total input impedance of the connections to the reference voltage sources or ground 46. The resistor 84 provides a final compensating resistor in representing the parallel impedance of resistor 76 and one of the input impedances 40, 52 or 58.

As will be apparent from the above description, the present inventive concept can be practiced in various forms and thus I wish to be limited only by the scope of the appended claims.

What is claimed is:

1. Apparatus for converting from a digital word to an analog output comprising, in combination:
    serial adder means, including first and second inputs, for adding two digital input words and providing at output means thereof in the alternative either the sum of the two inputs at a first output and an indication of no overflow at a second output or the remainder after overflow at said first output and an indication of overflow at a third output;
    accumulation means, connected between said first output and said first input of said adder means;
    further means, connected to said second input means of said adder means, further supplying thereto a digital word to be converted; and
    switch means for generating pulses each of said pulses being produced in response to a corresponding overflow indication provided at said third output of said adder means;
    means to which said generated pulses are immediately applied for filtering the pulses to thereby produce an analog output of magnitude dependent upon the frequency of said pulses to indicate the value of the digital word supplied to the second input of said adder means.

2. Apparatus as claimed in claim 1 wherein:
    said accumulation means is a shift register for returning a digital word received from said first output of said adder means to said first input thereof; and
    said third output of said adder means provides separate signals indicative, respectively, of positive and negative overflow.

3. Apparatus for converting a digital word to an analog output comprising:
    an adder including first and second inputs for adding two digital words and providing (a) the sum of the two words at a first output and an indication of no overflow at a second output, when no overflow from the sum occurs, and (b) the remainder after overflow at said first output and an overflow indication at a third output, when an overflow from the sum occurs;
    an accumulator connected between said first output and said first input;
    means for supplying a digital word to be converted to said second input;
    filter means to provide the analog output including an amplifier having feedback means;
    first switch means controlled by the overflow indication at said third output to selectively apply a predetermined voltage to said amplifier;
    second switch means controlled by the no overflow condition at said second output to selectively apply a reference potential to said amplifier;
    and means for providing temperature sensitive impedance compensation in said feedback means for temperature induced impedance variations in said first and second switch means.

4. Apparatus as claimed in claim 3 wherein said temperature sensitive impedance compensation providing means is a third switch means having a similar impedance to that of said first and second switch means.

5. Apparatus as claimed in claim 4 further comprising leakage means for providing a signal to said amplifier to compensate for leakage occurrence in said first, second, and third switch means.

6. Apparatus as claimed in claim 3 wherein said third output provides separate signals indicative, respectively, of positve and negative overflow.

* * * * *